(12) United States Patent
Lee

(10) Patent No.: US 6,635,590 B2
(45) Date of Patent: Oct. 21, 2003

(54) APPARATUS AND METHOD FOR IN-SITU REMOVAL OF POLYMER RESIDUE

(75) Inventor: Jow-Feng Lee, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 54 days.

(21) Appl. No.: 10/042,890

(22) Filed: Jan. 8, 2002

(65) Prior Publication Data

US 2003/0129854 A1 Jul. 10, 2003

(51) Int. Cl.[7] ............................................... H01L 21/00
(52) U.S. Cl. ........................................ 438/906; 134/26
(58) Field of Search ..................... 134/2–3, 26, 28–31; 438/704, 710, 719, 723, 906–908

(56) References Cited

U.S. PATENT DOCUMENTS

| | | | | |
|---|---|---|---|---|
| 3,869,313 A | * | 3/1975 | Jones et al. ................... | 134/73 |
| 5,896,875 A | * | 4/1999 | Yoneda .................... | 134/102.3 |
| 6,284,055 B1 | * | 9/2001 | Dryer et al. .................. | 134/10 |
| 6,491,763 B2 | * | 12/2002 | Verhaverbeke et al. ....... | 134/26 |

* cited by examiner

Primary Examiner—David Nelms
Assistant Examiner—David Vu
(74) Attorney, Agent, or Firm—Tung & Associates

(57) ABSTRACT

A method and apparatus for practicing the method is described for an in-situ wet polymer stripping process following an etching process, the method including, providing at least one solution container disposed outside the wafer cleaning chamber; providing at least one solution bath disposed within the wafer cleaning chamber; providing a solution in the at least one solution container; providing at least one fluidic pathway in communication with the at least one solution container and the at least one solution bath for supplying the solution to the at least one solution bath; controllably supplying the solution from the at least one solution container to the at least one solution bath; immersing the at least one process wafer into the at least one solution bath; and drying the at least one process wafer.

20 Claims, 2 Drawing Sheets

APPARATUS AND METHOD FOR IN-SITU REMOVAL OF POLYMER RESIDUE

FIELD OF THE INVENTION

This invention generally relates to removal of polymer residues following an etching process and more particularly to an in-situ wet polymer stripping (PRS) apparatus and processes whereby polymer residues are removed following an etching process.

BACKGROUND OF THE INVENTION

In the fabrication of semiconductor devices multiple layers may be required for providing a multi-layered interconnect structure. During the manufacture of integrated circuits it is common to place material photoresist on top of a semiconductor wafer in desired patterns and to etch away or otherwise remove surrounding material not covered by the resist pattern in order to produce metal conductor runs or other desired features. During the formation of semiconductor devices it is often required that the conductive layers be interconnected through holes in an insulating layer. Such holes are commonly referred to as contact holes, i.e., when the hole extends through an insulating layer to an active device area, or vias, i.e., when the hole extends through an insulating layer between two conductive layers. The profile of a hole is of particular importance since that it exhibits specific electrical characteristics when the contact hole or via is filled with a conductive material.

In anisotropic etching processes, such as those using halocarbon containing plasmas, polymer deposition on the sidewalls and bottom surface of the contact hole or via being etched occurs simultaneously with the etching of the oxide or the metal, as the case may be. Surfaces struck by the ions at a lower rate tend to remove the nonvolatile polymeric residual layer at a lower rate, thereby at steady state, leaving a layer of nonvolatile polymeric or metal-polymeric residue on surfaces such as the sidewalls of the etched opening, thereby protecting such surfaces against etching by the reactive gas. As such, etching is performed preferentially in a direction perpendicular to the wafer surface since the bottom surfaces etch at a higher rate than the polymeric residue containing sidewalls (i.e., anisotropic etching). If metal is being etched, for example, in the case where an oxide is etched through to expose an underlying metal layer, metal will simultaneously deposit with the polymer thus forming a metal-polymer residue on the sidewalls of the etched opening.

In a typical process, for example, in a via hole etch process, an inter-metal dielectric (IMD) layer is provided over a metallic contact layer, and a photoresist layer is provided over the IMD layer, the photoresist layer being patterned for etching through the IMD layer to the metal contact layer.

After the via holes are etched, but before the holes are filled with a conductive material, the photoresist mask which remains on top of the desired features may be removed by a dry etching method known as a reactive ion etch (RIE) or ashing process in a quartz chamber using a plasma of $O_2$ or a combination of $CF_4$ and $O_2$ to react with the photoresist material.

It has been the practice in the art to remove at least the photoresist in-situ by an ashing process following an etching procedure where metal is exposed, for instance after etching through the IMD layer to the metal conductive layer, since exposure of the metal to atmospheric conditions can cause metallic corrosion. In such an in-situ ashing process, the photoresist removal may take place by a reactive ion etching (RIE) method using an oxygen containing plasma in a stripper chamber module of a metal etcher such as, for example, the LAM TCP 9600 DSQ Stripper Chamber. The LAM Research TCP 9600 single wafer metal etcher is an example of a state-of-the-art single wafer RIE or plasma etch tool for etching metal conductor patterns, such as aluminum or aluminum-silicon-copper alloys. The Stripper Chamber is just one module in a series of modules included a metal etching apparatus as in, for example, the LAM TCP 9600.

A representative schematic layout of a series of modules for metal etching and photoresist stripping in a typical metal etching apparatus is shown in FIG. 1. In a typical process, a wafer is inserted into the load indexer 10, from which it is remotely transferred to the wafer orienter 12, as indicated by an arrow representing process flow direction, then to the entrance loadlock module 14, and finally to the reaction chamber module 16 where the main etching process takes place including metal etching. After etching, the wafer is moved downstream to a DSQ (DownStream Quartz) asher/stripper module 18 where the photoresist mask is removed by an ashing process involving a reactive ion etch (RIE) using an oxygen containing plasma. Following the ashing process, the wafer substrate is transferred to the APM (Atmospheric Passivation Module) 20 where it is rinsed in a deionized water bath 21 supplied through deionized water supply 22 through line 23 to remove any residual halogens from the metal etching process such as chlorine. Finally the wafer substrate is transferred to the unload indexer 24 for unloading of the wafer.

Maximum efficiency for such an in-line processing is obtained when processes are simultaneously performed in both chambers and when the process times for each chamber (module) are approximately equal, so that one of the chambers does not stand idle while awaiting completion of the process in the other chamber.

A processing difficulty arises, however, when a metal-polymer residue forms upon etching for example, a via hole. In a typical etching process, etching takes place through the inter-metal dielectric (IMD) layer to expose an underlying metallic contact. Typically the metallic portion is over etched to assure adequate contact of the via hole (which will later be filled with a metallic material) with the underlying metal contact layer. As a result, during the etching process, a metal-polymer residue is formed on the sidewalls of an etched opening that cannot be removed by the reactive ion etching (RIE) or ashing process.

Further, the RIE process to remove the overlying photoresist may tend to oxidize the metal-polymer residue formed on the sidewalls of an etched opening thereby making it even more resistant to an RIE cleaning process. As a result, the metal-polymer residue formed on the sidewalls of an etched opening cannot be successfully removed by an RIE process and must be removed by a wet process. It has been found necessary in the art to remove the process wafers from the metal etcher, to subject the process wafers with the metal-polymer residue to a wet polymer strip process (PRS) to remove the metal-polymer residue.

Since frequently, semiconductor device processing includes many layers that must be interconnected by vias or metal contact holes, removing a wafer from the metal etcher for wet chemical stripping or polymer stripping (PRS) to remove the metal-polymer residue remaining after each process where a metal layer is partially etched, can prove very time consuming when, for example, a 0.15 micron logic device with seven (7) metal layers is manufactured. In this case, for example, a throughput can be calculated to be about 1.5 hours per metal layer or alternatively, more than 12 hours per wafer lot.

Other drawbacks of an ex-situ wet polymer strip process (PRS), using for example a wet bench setup, include the possibility of particle contamination of the wafer upon removal from the metal etcher. Further, since adequate metal-polymer residue removal may require more than one process station where the wafer is immersed into a chemical solution, the chemical cost may be high.

FIG. 2 shows a typical wet polymer strip process (PRS) bench configuration 200. In a typical wet polymer strip process, wafers are loaded into a loading module 201, transferred to a wet bench process line beginning with a mounting station 202. The wafer is typically immersed in a plasma etching cleaning solution at one or more stations e.g., 204A, 204B, using for example, ACT (e.g., 690C) available from Ashland Chemical composed of DMSO (Dimethyl-sulphur-oxuide), MEA (Mono-Ethyl-Amine) and catechol. The wafers are then typically immersed in a neutralizing solution of n-methyl pyrrolidone (NMP) at station 206, followed by a QDR (quick dump rinse) in water at station 208, a soak in water at one or more pool stations e.g., 210A, 210B, and finally to a drying station 212, before unloading at unloading module 214. The sequence among the various washing modules can be programmed and can be out of order. As previously mentioned, the ex-situ wet polymer strip process (PRS) greatly reduces the efficiency and processing throughput in manufacturing process where metal etching is performed.

There is therefore a need in the semiconductor processing art to develop an improved cleaning apparatus and method whereby metal-polymer residues following an RIE etching process where, for example, a portion of the etched metal is deposited together with polymeric residues (i.e., metal-polymer) on the sidewalls of etched openings, can be removed faster and more efficiently giving a higher throughput.

It is therefore an object of the invention to provide an apparatus whereby a wet polymer strip process can be employed more efficiently thus increasing a throughput per metallic layer in a semiconductor manufacturing process to remove metal-polymer residues while overcoming other shortcomings and deficiencies in the prior art.

It is another object of the invention to provide a method whereby a wet polymer strip process can be employed more efficiently thus increasing a throughput per metallic layer in a semiconductor manufacturing process to remove metal-polymer residues while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method and apparatus for in-situ removal of etching residues following an etching process.

In a first embodiment according to the present invention, is provided a cleaning module for removing a polymer residue from a process wafer in-situ following an etching process which includes a chamber with means for controlling an ambient disposed adjacent to a reactive ion etching chamber; a remote handling means whereby a process wafer is transferred from the reactive ion etch chamber to the wafer cleaning chamber under controllable ambient conditions; at least one solution container disposed outside the wafer cleaning chamber; at least one solution bath disposed within the wafer cleaning chamber for containing a solution whereby at least one process wafer is submersible therein for in-situ cleaning; and at least one fluidic pathway in communication with the at least one solution container and one solution bath for supplying and removing a solution to the at least one solution bath.

In a related embodiment, the at least one solution container includes a solution selected from the group consisting of etchant solution, neutralizing solution, and rinsing solution.

In another embodiment according to the present invention, at least one second fluidic pathway is in communication with the at least one solution bath for removing the at least one solution outside the wafer cleaning chamber following a period of use.

In yet another embodiment according to the present invention, the at least one second fluidic pathway is in communication with the at least one solution container for recycling at least one solution.

In yet other aspects of the invention the at least one solution bath includes a means for heating a solution contained the at least one solution bath to a predetermined temperature. Further, the at least one solution bath comprises a means for agitating a solution contained in the at least one solution bath.

In a separate embodiment according to the present invention, is provided a method for in-situ removal an etching residue to increase a process throughput comprising the steps of: providing a wafer cleaning chamber adjacent to a reactive ion etch chamber; controlling an ambient in the wafer cleaning chamber and reactive ion etch chamber; providing a remote handling means whereby a process wafer is transferred from the reactive ion etch chamber to the wafer cleaning chamber under controllable ambient conditions; transferring by remote handling means at least one process wafer following a reactive ion etch process from the reactive ion etch chamber to the wafer cleaning chamber under controllable ambient conditions; providing at least one solution container disposed outside the wafer cleaning chamber; providing at least one solution bath disposed within the wafer cleaning chamber; providing a solution in the at least one solution container; providing at least one fluidic pathway in communication with the at least one solution container and the at least one solution bath for supplying the solution to the at least one solution bath; controllably supplying the solution from the at least one solution container to the at least one solution bath; immersing the at least one process wafer into the at least one solution bath; and, drying the at least one process wafer.

These and other embodiments, aspects and features of the invention will become better understood from a detailed description of a preferred embodiment of the invention which is described in conjunction with the accompanying drawings.

DETAILED DESCRIPTION OF THE PREFERRED EMBODIMENTS

Figure 1:
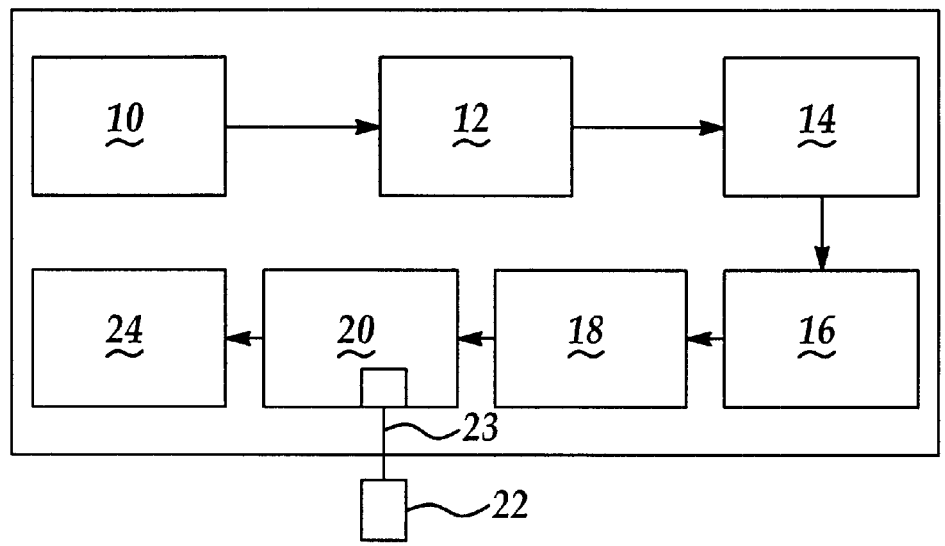
FIG. 1 is a schematic representation of a typical metal etcher according to the prior art.
Figure 2:
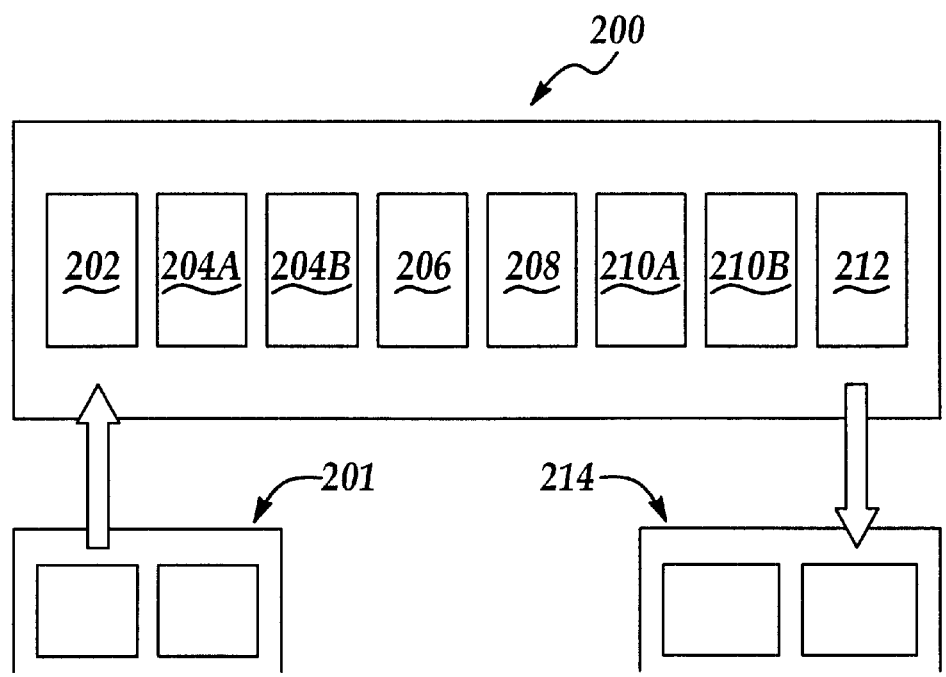
FIG. 2, is a schematic representation of a typical wet bench configuration for a wet polymer stripping (PRS) process according to the prior art.
Figure 3:
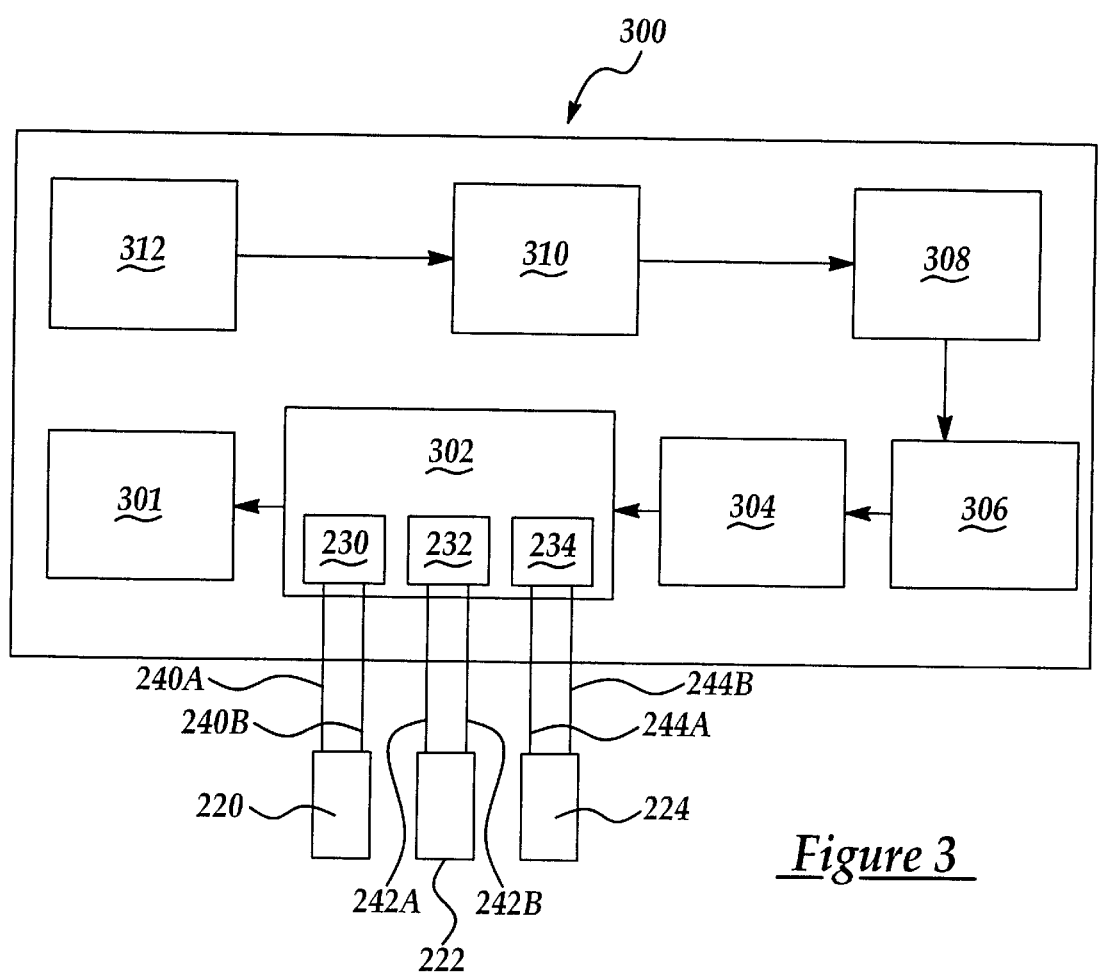
FIG. 3, is a schematic representation of the in-situ cleaning apparatus and method according to the present invention.

The method and apparatus according to the present invention is more clearly described by referring to FIG. 3 which depicts a metal etcher 300 with wafer cleaning chamber 302 disposed adjacent to a reactive ion etching (RIE) chamber 304.

The metal etcher may comprise several process modules including a wafer loading chamber 312, a wafer orienting chamber 310 equipped with a robotic arm (not shown), a loadlock chamber 308 for loading the wafer into an etching reaction chamber 306 where the main plasma etching process including metal etching in the presence of fluorine or chlorine containing compounds takes place. The arrows depicted in FIG. 3 connecting the process modules (chambers) indicate a typical process flow. The metal etcher may comprise a LAM Research TCP™-9600 which includes the several modules (chambers) described.

The reactive ion etching (RIE) chamber 304 is disposed adjacent the reaction chamber 306 for in-situ transfer of an etched wafer following a main etch process to the reactive ion etching chamber 304 for removal of the photoresist layer by a process frequently referred to as an ashing process. During the ashing process the photoresist is removed by reactive ion etching in the presence of an oxygen containing plasma. A suitable configuration for example, is the TCP™-9600 includes which includes a DSQ (Downstream Quartz) asher/stripper (e.g., 304). One recipe of RIE chamber 304 conditions for stripping the photoresist mask, for example, includes 900 mTorr total pressure, 1200 Watts RF power, 250 sccm $O_2$ flow rate, 250 sccm $H_2O$ flow rate, and 140 second process time.

Following etching in RIE Chamber 304 the wafer is removed to wafer cleaning module 302 for cleaning according to the present invention. The wafer is remotely transferred by conventional means well known in art, for example, a robotic arm, under controlled ambient conditions to protect against exposure to atmospheric conditions which will induced corrosive action of residual halogens on metal surfaces. The means for controlling the ambient can be any conventional means known in the art as are provide, for example, in the TCP™-9600 system.

While according to the prior art, a wafer cleaning module known as an atmospheric passivation (APM) module provided for rinsing with deionized water, in for example, the TCP™-9600 system, the wafer cleaning module 302 according to the present invention incorporates an in situ cleaning procedure for removing metal-polymer residue thereby avoiding corrosive action, particle contamination, and providing for higher wafer throughput.

In the wafer cleaning module according to the present invention, by way of example, at least one solution container 220 is disposed outside the wafer cleaning chamber for containing a solution. Preferably, there are three solution containers, such as 220, 222, and 224. It will be appreciated, however, that there may be more or less than three solution containers depending on the cleaning process desired as will be further explained below.

Additionally, there is at least one solution bath 230 is disposed within the wafer cleaning chamber for containing a solution whereby at least one process wafer is submersible therein for in-situ cleaning. Preferably, there are three (3) solution baths 230, 232, and 234 each of sufficient size to accommodate immersion of a wafer as are common in the art. It will be appreciated, however, that there may be more or less than three solution containers depending on the cleaning process desired as will be further explained below.

Further, there is at least one fluidic pathway (e.g., 240A) in communication with the at least one solution container (e.g., 220) and one solution bath (e.g., 230) for supplying and removing a solution fluid to the at least one solution bath (e.g., 230). It is preferable however, that at least one second fluidic pathway (e.g., 240B) is in fluidic communication with the at least one solution bath (e.g., 230) for removing the at least one solution outside the wafer cleaning chamber following a period of use.

The second fluidic pathway will make the addition and removal of solution fluid easier, thus adding and removing a certain amount while avoiding contaminating the fluidic pathways. The fluidic pathways may be made out of commonly used chemically resistant materials and sealably fed into and out of the ambient controlled wafer cleaning chamber by any commonly known means.

More preferably, are three (3) first and second fluidic pathways, 240A, 240B, 242A, 242B, 244A, and 244B that are in fluidic communication with the three (3) solution baths 230, 232, and 234 for independently supplying and removing a solution fluid.

In another aspect of the invention, the three (3) second fluidic pathways, 240B, 242B, and 244B are in fluidic communication with the three (3) solution containers 220, 222, and 223, thus allowing for the used fluid removed from the solution baths 230, 232, and 234 by way of second fluidic pathways, 240B, 242B, and 244B to be returned to the solution containers 220, 222, and 224 for cleaning and recycling by means well known in the art.

Preferably, according to the present invention the three (3) solution containers 220, 222, and 224 in fluidic communication with corresponding solution baths 230, 232, and 234 include an etching solution, a neutralizing solution, and a rinsing solution. It will be appreciated that more than one etching solution and bath may be included according to the present invention as well as more than one neutralizing solution and bath and more than one rinsing solution.

Further, the various solution baths may be provided with means for agitation and/or heating the baths by means well known in the art.

In operation, the solutions are controllably delivered to baths situated within the cleaning chamber by well known means that may include conventionally available programmable valves and pumps to control fluid delivery.

Preferably, the etchant solution may be any commercially available etchant solutions such as, for example, ACT (e.g., 690C) available from Ashland Chemical and composed of DMSO (Dimethyl-sulphur-oxuide), MEA (Mono-Ethyl-Amine) and catechol or EKC 265, available from EKC Technology, Inc., composed of water, alkanolamine, catechol and hydroxylamine.

The neutralizing solution may be any commercially available neutralizing solution such as such as isopropyl alcohol, n-methyl pyrrolidone (NMP) or solutions thereof.

In operation, by way of example, the wafer is first dipped into and ACT bath (e.g., 234) for conducting a first etch reaction. The ACT solution is normally maintained at a temperature within a range of about 75° C. to about 150° C. After a suitable time period of immersion in the ACT solution, for example, about 15 minutes, the wafer may be moved to a second ACT bath (not shown) where it is again immersed for a suitable length of time, for example, about 15 minutes. The wafer is then immersed in a neutralizing bath (e.g., 232) to substantially neutralize the residual acidic ACT solution remaining on the wafer surface. The neutralizing solution may contain a solution such as isopropyl alcohol or NMP and is typically maintained in a temperature range of about 75° C. to about 150° C.

The wafer is immersed in the neutralizing solvent for a sufficient length of time to substantially neutralize the ACT, which may typically be about 15 minutes. The wafer is then immersed in rinse bath (e.g., 230) for a rinse with deionized water. Following the rinse a final rinse or soak may take place in a deionized water bath (not shown) prior to transferring the wafer to a drying chamber 301.

A robot arm or any other conventional remote operation means may be used to transport the wafers into various baths. Further, it will be appreciated that the remote operation means may be programmed so that the baths may be accessed more than once or in any order. The sequence among the various solution baths can be programmed and can be in any desired sequence as will be readily determined by those skilled in the art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A cleaning module for removing a polymer residue from a process wafer in-situ following an etching process comprising:

a chamber with means for controlling an ambient disposed adjacent to a reactive ion etching chamber;

a remote handling means whereby a process wafer is transferred from the reactive ion etch chamber to the wafer cleaning chamber under controllable ambient conditions;

at least one solution container disposed outside the wafer cleaning chamber;

at least one solution bath disposed within the wafer cleaning chamber for containing a solution whereby at least one process wafer is submersible therein for in-situ cleaning; and at least one fluidic pathway in communication with the at least one solution container and one solution bath for supplying and removing a solution to the at least one solution bath.

2. The cleaning module of claim 1, wherein the at least one solution container comprises a solution selected from the group consisting of etchant solution, neutralizing solution, and rinsing solution.

3. The cleaning module of claim 2, wherein:

the etchant solution comprises at least one compound selected from the group consisting of Dimethyl-sulphur-oxide, Mono-Ethyl-Amine, catechol and hydroxylamine;

the neutralizing solution comprises at least one compound selected from the group consisting of isopropyl alcohol and n-methyl pyrrolidone; and the rinsing solution comprises deionized water.

4. The cleaning module of claim 1, further comprising at least one second fluidic pathway in communication with the at least one solution bath for removing the at least one solution outside the wafer cleaning chamber following a period of use.

5. The cleaning module of claim 4, wherein the at least one second fluidic pathway is in communication with the at least one solution container for recycling at least one solution.

6. The cleaning module of claim 5, wherein the at least one solution is selected from the group consisting of etchant solution, neutralizing solution, and rinsing solution.

7. The cleaning module of claim 6, wherein:

the etchant solution comprises at least one compound selected from the group consisting of Dimethyl-sulphur-oxide, Mono-Ethyl-Amine, catechol and hydroxylamine;

the neutralizing solution comprises at least one compound selected from the group consisting of isopropyl alcohol and n-methyl pyrrolidone; and the rinsing solution comprises deionized water.

8. The cleaning module of claim 5, wherein the at least one solution bath comprises a means for heating a solution contained the at least one solution bath to a predetermined temperature.

9. The cleaning module of claim 5, wherein the at least one solution bath comprises a means for agitating a solution contained in the at least one solution bath.

10. The cleaning module of claim 1, wherein the at least one solution bath comprises a means for heating a solution contained the at least one solution bath to a predetermined temperature.

11. The cleaning module of claim 1, wherein the at least one solution bath comprises a means for agitating a solution contained in the at least one solution bath.

12. A method for in-situ removal an etching residue to increase a process throughput comprising the steps of:

providing a wafer cleaning chamber adjacent to a reactive ion etch chamber;

controlling an ambient in the wafer cleaning chamber and reactive ion etch chamber;

providing a remote handling means whereby a process wafer is transferred from the reactive ion etch chamber to the wafer cleaning chamber under controllable ambient conditions;

transferring by remote handling means at least one process wafer following a reactive ion etch process from the reactive ion etch chamber to the wafer cleaning chamber under controllable ambient conditions;

providing at least one solution container disposed outside the wafer cleaning chamber;

providing at least one solution bath disposed within the wafer cleaning chamber;

providing a solution in the at least one solution container;

providing at least one fluidic pathway in communication with the at least one solution container and the at least one solution bath for supplying the solution to the at least one solution bath;

controllably supplying the solution from the at least one solution container to the at least one solution bath;

immersing the at least one process wafer into the at least one solution bath; and, drying the at least one process wafer.

13. The method claim 12, wherein the solution is selected from the group consisting of etchant solution, neutralizing solution, and rinsing solution.

14. The method claim 13, wherein:

the etchant solution comprises at least one compound selected from the group consisting of Dimethyl-sulphur-oxide, Mono-Ethyl-Amine, catechol and hydroxylamine;

the neutralizing solution comprises at least one compound selected from the group consisting of isopropyl alcohol and n-methyl pyrrolidone; and the rinsing solution comprises deionized water.

15. The method claim 12, further comprising the steps of:

providing at least one second fluidic pathway in communication with the at least one solution bath for removing the at least one solution outside the wafer cleaning chamber;

removing the solution outside the wafer cleaning chamber following a period of use.

16. The method claim 15, wherein the at least one second fluidic pathway is in communication with the at least one solution container for recycling the solution.

17. The method claim 16, wherein the solution is selected from the group consisting of etchant solution, neutralizing solution, and rinsing solution.

18. The method of claim 17, wherein:

the etchant solution comprises at least one compound selected from the group consisting of Dimethyl-sulphur-oxide, Mono-Ethyl-Amine, catechol and hydroxylamine;

the neutralizing solution comprises at least one compound selected from the group consisting of isopropyl alcohol and n-methyl pyrrolidone; and the rinsing solution comprises deionized water.

19. The method claim 12, further comprising the step of heating a solution in the at least one solution bath to a predetermine temperature.

20. The method claim 12, further comprising the step of agitating the solution in the at least one solution bath.

* * * * *